United States Patent
Kubota et al.

(10) Patent No.: US 7,919,217 B2
(45) Date of Patent: *Apr. 5, 2011

(54) PELLICLE AND METHOD FOR PRODUCING PELLICLE

(75) Inventors: Yoshihiro Kubota, Gunma (JP); Shoji Akiyama, Gunma (JP); Toshihiko Shindo, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/466,042

(22) Filed: May 14, 2009

(65) Prior Publication Data

US 2009/0291372 A1    Nov. 26, 2009

(30) Foreign Application Priority Data

May 22, 2008 (JP) ................................. 2008-134261

(51) Int. Cl.
*G03F 1/00* (2006.01)
*A47G 1/12* (2006.01)

(52) U.S. Cl. ............................................. 430/5; 428/14

(58) Field of Classification Search .......... 430/5; 117/8, 117/104, 200; 250/492.2; 355/30, 67; 438/458, 438/478; 428/14

See application file for complete search history.

(56) References Cited

U.S. PATENT DOCUMENTS

| | | | | |
|---|---|---|---|---|
| 5,935,733 A | * | 8/1999 | Scott et al. | 430/5 |
| 6,623,893 B1 | * | 9/2003 | Levinson et al. | 430/5 |
| 2003/0228529 A1 | * | 12/2003 | Dieu et al. | 430/5 |
| 2005/0048380 A1 | * | 3/2005 | Nagata | 430/5 |
| 2006/0281283 A1 | * | 12/2006 | Yoshida et al. | 438/478 |
| 2008/0158535 A1 | * | 7/2008 | Goldstein et al. | 355/67 |
| 2009/0104544 A1 | * | 4/2009 | Kubota et al. | 430/5 |
| 2009/0274962 A1 | * | 11/2009 | Kubota et al. | 430/5 |

OTHER PUBLICATIONS

U.S. Appl. No. 12/434,021, filed May 1, 2009, Kubota et al.
Yashesh A. Shroff, et al., "EUV Pellicle Development for Mask Defect Control", Proc. Of SPIE, vol. 6151, 2006, pp. 615104-1 to 615104-10.
Isao Yamada, "Cluster Ion Beam Technology", Chapter 4, pp. 127-206 (with English Translation of pp. 176-179).
Fumio Shimura, "Semiconductor Silicon Crystal Technology", Chapter 2, Paragraph 2.2, Academic Press, Inc, 1989, pp. 19-21.
Fumio Shimura, "Semiconductor Silicon Crystal Technology", Chapter 3, Academic Press, Inc, 1989, pp. 22-81.

* cited by examiner

*Primary Examiner* — Stephen Rosasco
*Assistant Examiner* — Stewart A Fraser
(74) *Attorney, Agent, or Firm* — Oblon, Spivak, McClelland, Maier & Neustadt, L.L.P.

(57) ABSTRACT

A pellicle film of a silicon single crystal film and a base substrate supporting the pellicle film are formed of a single substrate using an SOI substrate. The base substrate is provided with an opening whose ratio in area to an exposure region when a pellicle is used on a photomask (an open area ratio) is 60% or more, and provided with a reinforcing frame in a non-exposure region of the base substrate. Since the pellicle film and the base substrate supporting the pellicle film are formed of the single substrate (an integrated structure), and the base substrate is provided with the reinforcing frame, the effect of increased strength is obtained. Moreover, a principal plane of a silicon single crystal film is a crystal plane inclined at 3 to 5° from any lattice plane belonging to {100} planes or {111} planes.

16 Claims, 4 Drawing Sheets

PELLICLE AND METHOD FOR PRODUCING PELLICLE

This application claims priority from Japanese Patent Application No. 2008-134261 filed May 22, 2008, which is incorporated hereinto by reference in its entirely.

BACKGROUND OF THE INVENTION

1. Field of the Invention

The present invention relates to a pellicle for lithography. More particularly, the present invention relates to a pellicle suitable for lithography using extreme ultra violet (EUV) light, and a method for producing the same.

2. Description of the Related Art

With high integration of semiconductor devices, patterns formed by lithography are microminiaturized, and currently devices having a pattern width of about 45 nm are being put to practical use. Such a narrow line pattern can be realized by lithography based on a manner such as an ArF immersion method and a double exposure method which are improved techniques of conventional excimer exposure technologies.

However, in such lithography based on the excimer exposure technologies, it is regarded as difficult to meet patterning requiring further miniaturization with a pattern width of 32 nm or less. Therefore, lithography using extreme ultra violet (EUV) light has attracted attention as a new exposure technology to replace the lithography based on the excimer exposure technologies.

To put to practical use an exposure technology using EUV light having a dominant wavelength of 13.5 nm, it is indispensable to develop not only a light source, but also a new resist, a pellicle, and the like. Among these, development for the light source and resist has been already made substantial progress, whereas for pellicle, many technical problems which have to be solved for realization of a pellicle for EUV remain unsolved.

A pellicle film provided in a pellicle for EUV requires not only a dust-proof function for preventing adherence of foreign matters on a photomask, but also high transmission for EUV light and chemical stability. However, the prospects for resolution of problems of such high transmission and chemical stability, and further the material development for a practical pellicle film having an excellent fabrication yield are still far from certain at present.

Although a transparent material for light in a wavelength range having a dominant wavelength of 13.5 nm is currently not known, silicon has relative high transmittance for the light having such a wavelength, and therefore silicon has attracted attention as a pellicle film material for EUV. As regards this, for example, see Shroff et al. "EUV pellicle Development for Mask Defect Control," Emerging Lithographic Technologies X, Proc of SPIE Vol. 6151 615104-1 (2006) (Non-Patent Document 1) and U.S. Pat. No. 6,623,893 (Patent Document 1).

However, silicon used as a pellicle film in Non-Patent Document 1 is a film deposited by a sputtering method or the like, and therefore necessarily become amorphous, inevitably resulting in the high absorption coefficient and low transmittance in the EUV region.

Although a pellicle film disclosed in Patent Document 1 is also made of silicon, this silicon film is premised on a deposition by CVD method or the like. In this case, the silicon film results in an amorphous or polycrystalline film, and therefore the absorption coefficient in the EUV region inevitably have a high value.

In addition, there are also the following problems: as the pellicle films disclosed in Patent Document 1 and Non-Patent Document 1, a strong stress is easily introduced into a silicon crystal formed by a sputtering or CVD methods, and the above stress easily results in deteriorated and uneven optical film properties.

Thus, the inventors solved the above shortcomings, invented a practical pellicle for EUV having high transmission and excellent chemical stability and a method for producing the same, and then filed an application (Japanese Patent Application No. 2007-293692 (unpublished)).

However, the result of a subsequent further study found the following problems: in the case where a silicon single crystal film having a (100) plane as its principal plane is used as a pellicle film in the invention according to the above patent application, the EUV pellicle has an excellent optical property, and however a crack or defect tends to occur in the silicon crystal film in steps of stripping, etching, handling, and the like when a silicon crystal is made into a thin film in a pellicle production process, thereby decreasing a fabrication yield. For this reason, the inventors further improve the invention according to the above patent application, and then filed a new patent application (Japanese Patent Application No. 2008-120664 (unpublished)).

A subsequent study by the inventors found that this improvement invention also still has the following drawbacks: edge chipping occurs due to vibrations during transportation or the like; the temperature of its silicon single crystal film increases due to the light energy during EUV exposure, so that a pellicle frame attached by an adhesive tends to cause warpage under thermal stress due to the difference in the rate of thermal expansion, cause distortion during adhering, or the like. Then, the inventors made a study to further improve it, and then reach to the present invention.

The meaning of signs used to represent a crystal plane and its orientation herein is described in, for example, Fumio, Shimura "Semiconductor Silicon Crystal Technology" Chapter 2, Paragraph 2.2, (Maruzen Co., Ltd. (1993): Non-Patent Document 2), which is generally used by those skilled in the art.

SUMMARY OF THE INVENTION

The present invention has been made in view of these problems, and an object of the present invention is to provide a pellicle comprising a pellicle film for EUV having high transmission, and excellent mechanical and chemical stability, as well as eliminating warpage and distortion during exposure and during adhering, having a high fabrication yield, and being also practical in cost.

In order to resolve these problems, a pellicle of the present invention comprises: a silicon single crystal film as a pellicle film, wherein the pellicle film and a base substrate supporting the pellicle film are formed of a single substrate; and wherein the base substrate is provided with an opening whose ratio in area to an exposure region when the pellicle is used on a photomask (an open area ratio) is 60% or more, and provided with a reinforcing frame in a non-exposure region of the base substrate.

For example, the opening is surrounded by a wall section formed into a window frame shape in the exposure region.

Preferably, the silicon single crystal film has an absorption coefficient of 0.005/nm or less for light having a wavelength of 13.5 nm.

Moreover, a principal plane of the silicon single crystal film, preferably, is a crystal plane inclined at 3 to 5° from any lattice plane belonging to {100} planes or {111} planes. For example, the lattice plane belongs to {100} planes, and the crystal plane is inclined at 3 to 5° in the <111> direction. Also, for example, the lattice plane belongs to {111} planes, and the crystal plane is inclined at 3 to 5° in the <110> direction.

The single substrate may use an SOI substrate, an SOQ substrate, or an SOG substrate.

The pellicle of the present invention may be configuration comprising a protection film on at least one surface of the silicon single crystal film. In this case, the protection film preferably has an absorption coefficient of 0.05/nm or less for light having a wavelength of 13.5 nm. Moreover, preferably, the protection film consists of at least one material of the group consisting of SiC, $SiO_2$, $Si_3N_4$, SiON, $Y_2O_3$, YN, Mo, Ru, and Rh.

In the present invention, the pellicle film and a base substrate supporting the pellicle film are formed of a single substrate, and the base substrate is provided with an opening whose ratio in area to an exposure region when the pellicle is used on a photomask (an open area ratio) is 60% or more, and provided with a reinforcing frame in a non-exposure region of the base substrate, and therefore, an integrated structure of the pellicle film and the base substrate is obtained, and the strength thereof can be increased by the reinforcing frame. Moreover, a principal plane of a silicon single crystal film is a crystal plane inclined at 3 to 5° from any lattice plane belonging to {100} planes or {111} planes, and therefore cleavage resistance and chemical stability are improved.

The result allows various mechanical and chemical treatments such as stripping, polishing and etching at the time of formation of a pellicle to be stably performed, thereby being able to considerably reduce occurrence of a crack, edge chipping, void, and the like resulting from impact and the like associated with handling and transportation.

Thus, the present invention allows for providing the pellicle comprising the pellicle film for EUV having high transmission, and excellent mechanical and chemical stability, as well as eliminating warpage and distortion during exposure and during adhering, having a high fabrication yield, and being also practical in cost.

DESCRIPTION OF THE PREFERRED EMBODIMENTS

A construction of a pellicle according to the present invention is described below with reference to drawings.

Figure 1A:
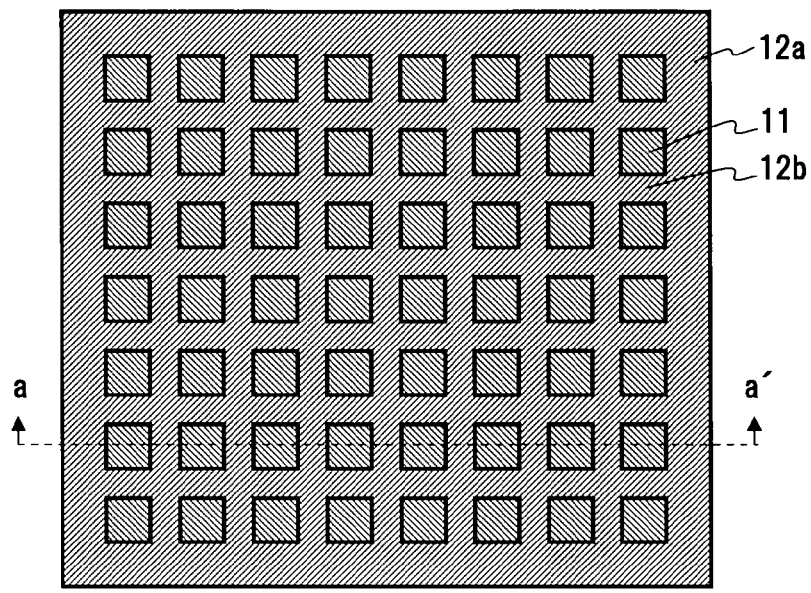
FIGS. 1A and 1B are sectional schematic views for explaining a first structural example of a pellicle of the present invention.
Figure 1B:
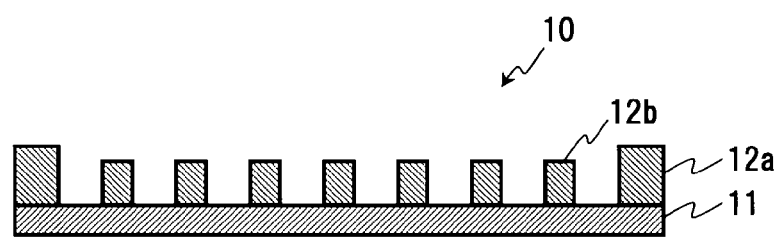

FIGS. 1A and 1B are views for explaining structural examples of a pellicle of the present invention, wherein FIG. 1A is a top plan schematic view, and FIG. 1B is a sectional schematic view taken along a-a' in FIG. 1A.

This pellicle 10 is a pellicle comprising a silicon single crystal film as a pellicle film, wherein a pellicle film 11 and a base substrate 12 supporting the pellicle film are formed of a single substrate.

The base substrate 12 is formed with an opening, which is provided by partially removing the base substrate, such that its ratio in area to an exposure region when the pellicle is used in a photomask (an open area ratio) is 60% or more, and provided with a reinforcing frame 12a in a non-exposure region (an outer periphery) of the base substrate 12.

In the pellicle illustrated herein, the opening is surrounded by a wall section 12b formed into a window frame shape.

The silicon single crystal film 11, which may also use a silicon single crystal film having its plane orientation <100> or <111>, preferably uses a silicon single crystal film having a crystal plane inclined at 3 to 5° from any lattice plane belonging to {100} planes or {111} planes.

Such silicon single crystal films, for example, include a silicon single crystal film having a crystal plane with a crystal orientation inclined at 3 to 5° from <100> to <111> direction (inclined at 3 to 5° from a lattice plane belonging to {100} planes to <111> direction), and a silicon single crystal film having a crystal plane with a crystal orientation inclined at 3 to 5° from <111> to <110> direction (inclined at 3 to 5° from a lattice plane belonging to {111} planes to <110> direction).

Crystal planes with crystal orientation <111> ({111} plane) include 8 crystal planes with crystal orientation [111], [11–1], [1–11], [–111], [1–1–1], [–11–1], [–1–11], [–1–1–1]. A crystal planes with the crystal orientation <111> may be any one of these crystal planes.

Similarly, <110> direction includes the 12 directions of [110], [–110], [–1–10], [1–10], [011], [0–11], [0–1–1], [01–1], [–101], [101], [–10–1], [10–1].

"shifted 3 to 5° from <111> to <110> direction" refers to, for example, being shifted 3 to 5° in [–110] direction, where the crystal orientation is [111].

Since a silicon single crystal film as the pellicle film 11 is an indirect transition-type semiconductor film, an absorption coefficient in EUV light is relatively lower than that of other material, and suitable for the pellicle film.

According to a study by the inventors, with reference to optical characteristics such as the absorption coefficient of the silicon single crystal films, there is little difference in relative merits resulting from the crystal orientation of its principal plane, while it is found that there is significant crystallographic-orientation-dependence in mechanical characteristics, chemical characteristics, or manufacturing cost such as yield.

As described above, the inventors invented the following and filed a patent application for it: a practical pellicle for EUV having high transmission and excellent chemical stability, in which a silicon single crystal film with (100) plane as its principal plane is used as a pellicle film; a method for producing the same; and further a method for utilizing a silicon single crystal film as the pellicle film, in which its principal plane is a crystal plane inclined at 3 to 5° from any lattice plane belonging to {100} planes or {111} planes for the purpose of improving its mechanical shortcoming.

However, an entire satisfaction is still not obtained in view of warpage, distortion and the like.

The silicon single crystal with its principal plane having a crystal orientation of <100>, <111> and the like has advantages of being relatively mechanically and chemically stable, having high electrical performance, having excellent workability, and being in balance for semiconductor use, and moreover being low-cost due to quantity production.

However, a crack and defect tend to occur in the silicon crystal film in a process such as stripping, etching, or handling when the silicon crystal is made into a thin film in a pellicle production process. Moreover, silicon single crystal substrates having crystal orientation of <110>, <511> and the like are impractical due to their small production volume and an economic disadvantage.

The pellicles having such configurations allow various mechanical and chemical treatments such as stripping, polishing and etching at the time of formation of a pellicle to be stably performed, thereby being able to considerably reduce occurrence of warpage, distortion and the like, as well as a crack, void, and the like resulting from impact and the like associated with handling.

This is considered to be because the pellicle film 11 and the base substrate 12 supporting the pellicle film are formed of a single substrate (an integrated structure), and the effect of increased strength is obtained due to the reinforcing frame provided on the base substrate, and additionally, for example, there are the following reasons.

The silicon single crystal having the crystal plane as its principal plane, the crystal plane being inclined at 3 to 5° (3°-off to 5°-off) from any lattice plane belonging to {100} planes or {111} planes, has, for example, effective bond density and Young's modulus thereof which are about 40% to about 50% higher than that of a silicon single crystal with <100> orientation, and therefore a cleavage and crack does not easily occur.

Such a silicon single crystal has a high chemical resistance such as hydrofluoric acid resistance, and hardly causes an etch pit and void.

On these points, for example, see F. Shimura, "*Semiconductor Silicon Crystal Technology*" Chapter 3, Academic Press, Inc. (1989) (Non-Patent Document 3).

Materials with a low absorption coefficient, such as a silicon single crystal, as the pellicle film material are required because such materials need to have a certain amount of the strength of a film, while transmitting EUV light as far as possible. In particular, this is because transmittance of EUV light (transmittance of light having a wavelength of 13.5 nm) is made to be 50% or more, for example, in a pellicle film having a thickness of about 20 nm to about 150 nm.

The intensity I of transmitted light of the pellicle film is expressed by the following Equation (1), where the absorption coefficient of the pellicle film is $\alpha$ (nm$^{-1}$), the film thickness is x (nm), and the intensity of incident light is $I_0$.

$$I = I_0 e^{-\alpha x} \quad \text{(Equation 1)}$$

Therefore, the thickness x of a pellicle film necessary to obtain the transmittance of EUV light being 50% or more is estimated to generally 0.693/$\alpha$ and if the absorption coefficient $\alpha$ is 0.005/nm or less, EUV transmittance of 50% can be ensured even if the pellicle film has a thickness of 140 nm. The silicon single crystal is optimum material that meets this requirement.

Preferably, such a pellicle film is made of a SOI film obtained by making an SOI substrate (The term "an SOI substrate" includes an SOQ substrate, and an SOG substrate) into a thin film by a manner described below, for example.

Figure 2:
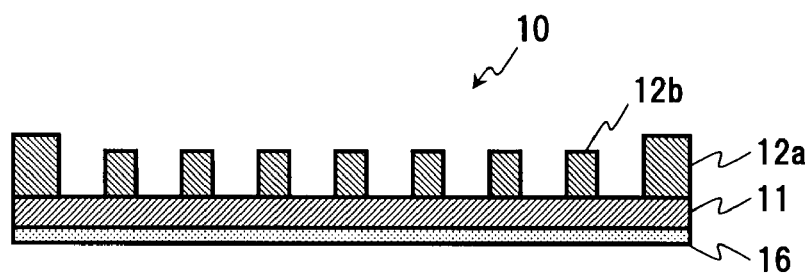
FIG. 2 is a sectional schematic view for explaining a second structural example of a pellicle of the present invention.

FIG. 2 is a sectional schematic view for explaining a second structural example of a pellicle of the present invention. As shown in this view, a pellicle 10 of the present invention may be provided with a protection film 16 on at least one principal plane of the silicon single crystal film which is the pellicle film 11 so as to cover the silicon crystal plane thereof.

Such a protection film plays a role in, e.g., preventing oxidation of a surface of the silicon single crystal film due to light from a high power light source. The protection films may include a ceramics film such as SiC, $SiO_2$, $Si_3N_4$, SiON, $Y_2O_3$, and YN, and a metal film such as Mo, Ru, and Rh. Moreover, the protection film may be a film of material obtained by combination thereof, or a film with a plurality of films laminated.

A forming method of the protection film is not particularly limited, and a film may be formed by a well-known CVD method, a sputtering method, an electron beam evaporation method, and the like, and however a gas cluster ion beam (GCIB) evaporation method enables formation of a closely packed protection film having a density close to the theoretical density, and have potential for obtaining high oxidation resistance even if a film are thin ("Cluster Ion Beam Technology", written and edited by Isao Yamada, chapter 4, Nikkan Kogyo Shimbun Ltd. (Non-Patent Document 4)).

Therefore, a GCIB evaporation method is suitable as the forming method of the protection film without decreasing a significant transmittance as a pellicle.

Since the protection film is easily formed relatively thin, its absorption coefficient does not have to be as low as a pellicle film, but preferably, its absorption coefficient for light having a wavelength of 13.5 nm is 0.05/nm or less. With the protection film provided, a thickness or the like of both films is designed such that the transmittance of EUV light passing through the above protection film and the pellicle film is 50% or more.

If the height of the pellicle is insufficient by using the base substrate alone, a pellicle frame may be further bonded to the outer periphery of the base substrate by a silicon single crystal or the like. A silicon single crystal has advantages of a high purity and being able to also ensure its mechanical strength, and further being able to also suppress dust generation when the pellicle frame is employed also.

When a transmissive film (the pellicle film and the protection film) gets soiled and a crack occurs therein, it is necessary to replace the above transmissive film. Thus, preferably, detachment and attachment of the transmissive film can be easily performed.

Therefore, preferably, bonding of the pellicle frame and the base substrate is not made by a fixing implement using a general adhesive or solder, but made by a detachable and attachable mechanical fixing implement such as an adhesive, a magnet, an electrostatic chuck, or a hook. Preferably, such a mechanical fixing member has a property that does not easily degenerate due to irradiation of EUV light, or is provided so as to be shielded from EUV light.

EUV exposure is performed under vacuum, while work for attaching the pellicle to the photomask is usually performed under ordinary pressure. For this reason, the pellicle frame is desirably provided with a pressure adjusting mechanism.

Such a pressure adjusting mechanism needs to be a structure so as to prevent foreign matters from mixing therein when gas flows into or out of the structure. Therefore, it is preferable to provide a filter such as ULPA, which can capture even extremely fine foreign matters, on the pressure adjusting mechanism. In such a filter, it is important to have an area to prevent a transmissive film from expanding and contracting, or from breaking, by an uneven differential pressure.

EXAMPLE 1

FIGS. 3A to 3D are views for explaining a process example of a method for producing a pellicle of the present invention. In the case where SOI substrates in a broad sense are an SOQ (Silicon On Quartz) substrate and an SOG (Silicon On Glass) substrate, support substrates (base substrates) thereof were a quartz substrate and a glass substrate, respectively. A support substrate of an SOI (Silicon On Insulator) substrate in a limited sense was a substrate provided with an oxide film on a silicon substrate surface.

Figure 3A:
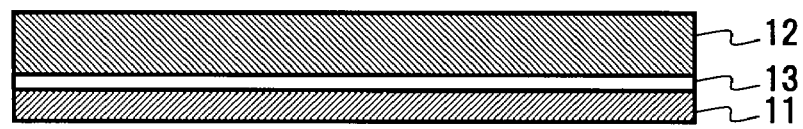
FIGS. 3A to 3D are views for explaining a process example of a method of producing a pellicle of the present invention.
Figure 3B:
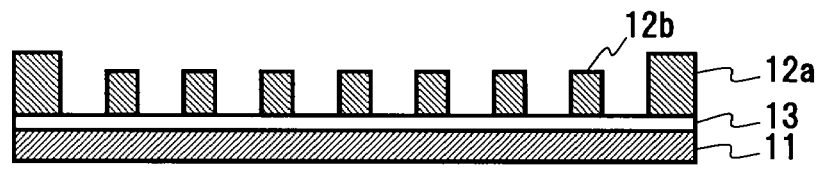

In FIGS. 3A to 3D, an example using the SOI substrate in a limited sense is illustrated, in which a silicon single crystal film 11 was provided on one principal plane of a support substrate (a base substrate) 12 via an oxide film 13 (FIG. 3A).

For the reason above-mentioned, the silicon single crystal film 11 was a film having a crystal plane as its principal plane, the crystal plane being inclined at 3 to 5° from a lattice plane belonging to {111} planes, the silicon single crystal film 11 was configured as the pellicle film. The silicon single crystal film 11 was a film having an absorption coefficient of EUV light of generally 0.0015 $nm^{-1}$ and a film thickness of about 70 nm.

A silicon substrate 12, which was a support substrate of the SOI substrate, was, for example, a generally available single-crystal silicon substrate grown by CZ method (Czochralski method). The oxide film 13 was previously formed on a surface of the single-crystal silicon substrate 12 with dimensions of about 100 nm by a process such as thermal oxidation. Then, the single-crystal silicon crystal film 11 having a crystal plane as its principal plane, the crystal plane being inclined at 3 to 5° from a crystal orientation <111> to <110> direction, was formed thereon as the SOI layer.

Figure 3C:
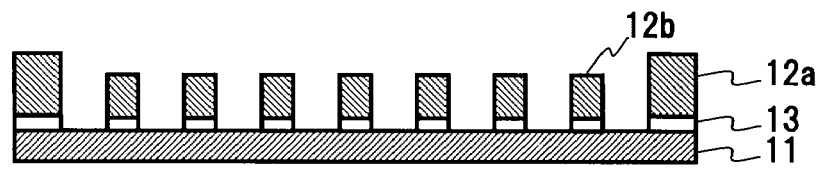

A rectangular substrate having a short side of 122 mm and a long side of 149 mm was prepared as the SOI substrate (similarly, the SOQ substrate and the SOG substrate). Then, a wall section (5 mm in width) serving as a reinforcing frame was formed in a support substrate section (an outermost peripheral edge section) in a non-exposure region when a pellicle is used in a photomask by partially removing the support substrate, from the back surface side (the top surface side in a corresponding figure) of the support substrate (the base substrate) 12, and a silicon wall was formed to provide openings, such that a window frame is obtained with the open area ratio of 70% in a part of an exposure region when a pellicle is used in a photomask (FIG. 3B), and the exposed oxide film 13 was removed (FIG. 3C).

In particular, first, the silicon substrate, which is the support substrate 12, was subjected to a counterbore by grinding and polishing to about 100 μm, and thereafter, the reinforcing frame was formed by leaving an outermost periphery width of 5 mm, the oxide film 13 was exposed by etching a silicon section made thin in an exposed area into a window frame shape by KOH etchant such that the open area ratio was 70%, and thereafter the oxide film 13 was removed by HF.

Figure 3D:
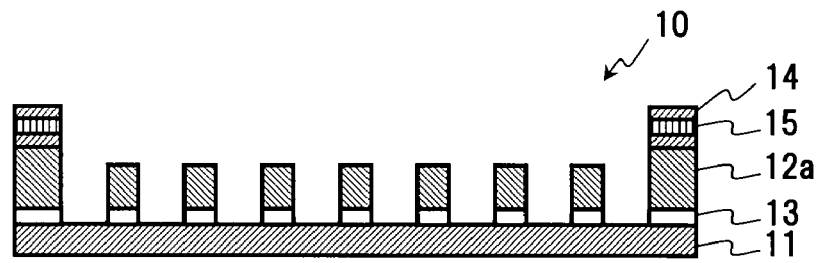

Subsequently, a pellicle frame 14 made of the silicon single crystal was bonded at 450° C. to a reinforcing frame 12a with gold foil (not shown) of 5 μm put therebetween, and a ULPA filter 15 was mounted to the pellicle frame 14 (FIG. 3D). This pellicle frame 14 had a height of 7 mm and a thickness of 2 mm, and was provided with a plurality of ULPA filter mounting openings on its side, and a groove having a width of 1 mm and a depth of 2 mm is formed in an outermost periphery on the back surface.

When an employed substrate is the SOQ or SOG substrates, by a similar procedure as described above, the support substrate 12 is subjected to a counterbore thinly by polishing from its back surface to about 100 μm, and thereafter a remaining $SiO_2$ section is removed by HF to leave only the silicon single crystal film, thereby being able to form the pellicle film 11.

Finally, a silicone adhesive was injected into the groove provided in the outermost periphery on the back surface of a pellicle frame 14, and thus the pellicle 10 is completed. This groove is a groove for shielding the silicone adhesive from exposure light.

As described above, the pellicle film and the base substrate supporting the pellicle film are formed of a single substrate using the SOI substrate (the SOQ substrate, the SOG substrate, the SOI substrate in a limited sense); and the base substrate is provided with an opening whose ratio in area to an exposure region (an open area ratio) is 60% or more when the pellicle was used in a photomask, and provided with a reinforcing frame in a non-exposure region of the base substrate, and therefore an integrated structure of the pellicle film and the base substrate is obtained, and the strength thereof can be increased by the reinforcing frame.

Moreover, the principal plane of the silicon single crystal film is a crystal plane inclined at 3 to 5° from any lattice plane belonging to {100} planes or {111} planes, and therefore cleavage resistance and chemical stability are improved.

The result allows various mechanical and chemical treatments such as stripping, polishing and etching at the time of formation of a pellicle to be stably performed, thereby being able to considerably reduce occurrence of a crack, edge chipping, void, and the like resulting from impact and the like associated with handling and transportation.

Thus, the present invention allows for providing the pellicle comprising the pellicle film for EUV having high transmission, and excellent mechanical and chemical stability, as well as eliminating warpage and distortion during exposure and during adhering, having a high fabrication yield, and being also practical in cost.

As described above, a protection film may be formed on at least one surface of the pellicle film 11 of the silicon single crystal film, or a substrate with the protection film formed previously on a silicon single crystal film may be used.

EXAMPLE 2

As described in EXAMPLE 1, the silicon substrate 12, which is the support substrate (the base substrate) of the SOI substrate, was subjected to a counterbore by grinding and polishing to about 150 μm, the reinforcing frame was formed by leaving the outermost periphery width of 5 mm, the oxide film 13 was exposed by etching a silicon section made thin in an exposed area into a window frame shape by KOH etchant such that the open area ratio was 75%, and thereafter the oxide film 13 was also removed by HF to leave only the silicon single crystal film 11, thereby forming the pellicle film.

A silicon single crystal having an orientation plane as its principal plane was used, the orientation plane with a crystal orientation of a silicon single crystal film inclined at 3 to 5° (3°-off to 5°-off) from <111> to <110> direction. Subsequently, this was bonded to the pellicle frame 12. The pellicle film 11 of the silicon single crystal film of the EXAMPLE had a thickness of 20 nm.

Then, on each of the front surface and back surface of the pellicle film 11, a SiC thin film having a thickness of a few nm was deposited by gas cluster ion beam evaporation method to coat the pellicle film 11 of the silicon single crystal film.

Every pellicle obtained by EXAMPLE 1 and EXAMPLE 2 had transmittance of EUV light of 50% or more, and throughput during EUV exposure was on a practical level. It was recognized that there was no degradation of yield of the device due to foreign matters at all.

In the above EXAMPLE, the case where the pellicle film was a single-crystal silicon film having a crystal plane as its principal plane, the crystal plane with a crystal orientation inclined at 3 to 5° from <111> to <110> direction (inclined at 3 to 5° from a lattice plane belonging to {111} planes to <110> direction), has been described. However, the principal plane of the silicon single crystal film may be a crystal plane inclined at 3 to 5° from any lattice plane belonging to {100} planes or {111} planes, and for example a single-crystal silicon film having a crystal plane as its principal plane, the crystal plane with a crystal orientation inclined at 3 to 5° from <100> to <111> direction (inclined at 3 to 5° from a lattice plane belonging to {100} planes to <111> direction), may be used as the pellicle film.

Figure 4A:
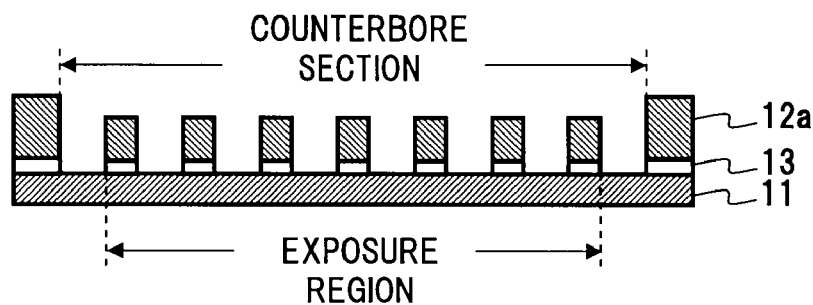
FIGS. 4A to 4C are views for illustrating an aspect of a counterbore.
Figure 4B:
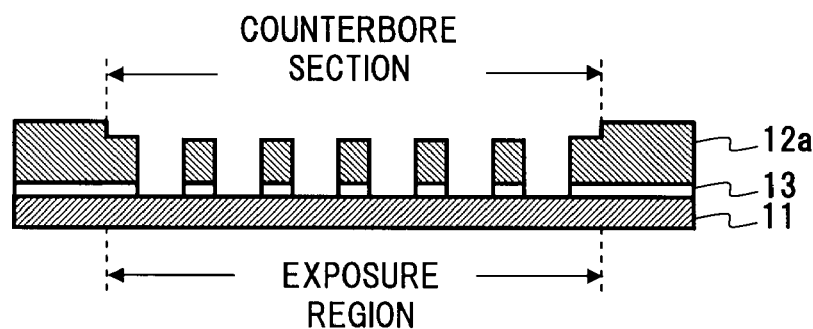
Figure 4C:
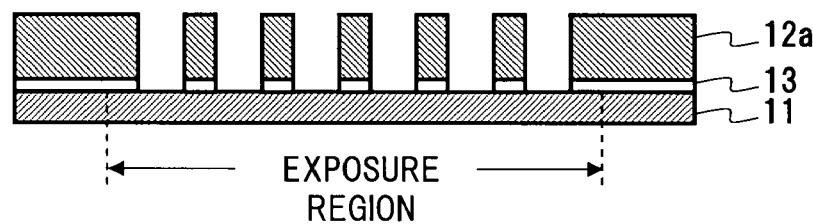

As illustrated in FIGS. 4A to 4C, the above counterbore may include various aspects. For example, the aspects include one aspect in which the counterboring is performed in not only the exposure region, but also (a part of) the non-exposure region (FIG. 4A), another aspect in which the counterbore is performed in only the exposure region (FIG. 4B), or a further aspect in which the counterbore is not performed in neither the exposure region nor the non-exposure region (FIG. 4C).

As described above, the present invention provides a pellicle comprising a pellicle film for EUV having high transmission, and excellent mechanical and chemical stability, eliminating warpage and distortion, as well as having a high fabrication yield, and being also practical in cost.

What is claimed is:

1. A pellicle comprising: a silicon single crystal film as a pellicle film;
   wherein the pellicle film and a base substrate supporting the pellicle film are formed of a single substrate and both the base substrate and the pellicle film are silicon single crystal; and
   wherein the base substrate is provided with an opening whose ratio in area to an exposure region when the pellicle is used on a photomask (an open area ratio) is 60% or more, and provided with a reinforcing frame in a non-exposure region of the base substrate.

2. The pellicle according to claim 1, wherein the opening is surrounded by a wall section formed into a window frame shape in the exposure region.

3. The pellicle according to claim 1, wherein the silicon single crystal film has an absorption coefficient of 0.005/nm or less for light having a wavelength of 13.5 nm.

4. The pellicle according to claim 1, wherein a principal plane of the silicon single crystal film is a crystal plane inclined at 3 to 5° from any lattice plane belonging to {100} planes or {111} planes.

5. The pellicle according to claim 4, wherein the lattice plane belongs to {100} planes, and the crystal plane is inclined at 3 to 5° in the <111> direction.

6. The pellicle according to claim 4, wherein the lattice plane belongs to {111} planes, and the crystal plane is inclined at 3 to 5° in the <110> direction.

7. The pellicle according to claim 1, wherein the single substrate is an SOI substrate, an SOQ substrate, or an SOG substrate.

8. The pellicle according to claim 1, comprising a protection film on at least one surface of the silicon single crystal film.

9. The pellicle according to claim 8, wherein the protection film has an absorption coefficient of 0.05/nm or less for light having a wavelength of 13.5 nm.

10. The pellicle according to claim 8, wherein the protection film consists of at least one material of the group consisting of SiC, $SiO_2$, $Si_3N_4$, SiON, $Y_2O_3$, YN, Mo, Ru, and Rh.

11. A method of producing a pellicle from a single substrate having a silicon single crystal film on a base substrate, the pellicle comprising a pellicle film consisting of the silicon single crystal film and the base substrate supporting the pellicle film, the method comprising the steps of:
    forming a wall section serving as a reinforcing frame on a base substrate section in a non-exposure region when the pellicle is used in a photomask by partially removing the base substrate; and
    providing, on a base substrate section in an exposure region when the pellicle is used on a photomask, an opening whose ratio in area to the exposure region (an open area ratio) is 60% or more,
    wherein the base substrate is silicon single crystal.

12. The method of producing a pellicle according to claim 11, further comprising forming a protection film on at least one surface of the silicon single crystal film.

13. The method of producing a pellicle according to claim 12, wherein the forming a protection film is performed by coating a film consists of at least one material of the group consisting of SiC, $SiO_2$, $Si_3N_4$, SiON, $Y_2O_3$, YN, Mo, Ru, and Rh.

14. The method of producing a pellicle according to claim 13, wherein a coating method of the protection film is a gas cluster ion beam evaporation method.

15. The pellicle according to claim 1, wherein the pellicle film and the base substrate are in direct contact.

16. The method of producing a pellicle according to claim 11, which is carried out to form a pellicle in which the pellicle film is in direct contact with the base substrate.

* * * * *